United States Patent [19]
Kondo

[11] Patent Number: 5,250,914
[45] Date of Patent: Oct. 5, 1993

[54] OSCILLATION CIRCUIT OPERATING WITH STABLE OSCILLATION FREQUENCY AT A SPECIFIC LOW POWER-SUPPLY VOLTAGE

[75] Inventor: Ichiro Kondo, Tokyo, Japan
[73] Assignee: NEC Corporation, Tokyo, Japan
[21] Appl. No.: 903,337
[22] Filed: Jun. 24, 1992

[30] Foreign Application Priority Data

Jun. 26, 1991 [JP] Japan .................. 3-153654

[51] Int. Cl.⁵ .......................................... H03K 3/356
[52] U.S. Cl. ..................................... 331/111; 331/144; 331/175
[58] Field of Search ................. 331/108 R, 111, 144, 331/175, 186

[56] References Cited

U.S. PATENT DOCUMENTS 4,714,901 12/1987 Jain et al. .................. 331/111 X
4,723,114  2/1988 D'Arrigo et al. ............ 331/111
4,983,931  1/1991 Nakano .................... 331/111

OTHER PUBLICATIONS

Sakurai et al., "A 36ns 1 Mbit Pseudo SRAM with VSRAM mode", IEEE Solid-State Circuits Council, Cat. No. 87, May 22–23, 1987, pp. 45–46.

Primary Examiner—David Mis
Attorney, Agent, or Firm—Sughrue, Mion, Zinn, Macpeak & Seas

[57] ABSTRACT

In an oscillation circuit, the Schmidt circuit generates the control signal of the first level when the charge-discharge voltage inputted from the capacitor shifts to a voltage higher than the first threshold voltage and generates the control signal of the second level when the charge-discharge voltage shifts to a level lower than the second threshold voltage. The switching circuit connects the second current source circuit with the capacitor when the control signal is of the first level and connects the first current source circuit with the capacitor when the control signal is of the second level.

7 Claims, 9 Drawing Sheets

OSCILLATION CIRCUIT OPERATING WITH STABLE OSCILLATION FREQUENCY AT A SPECIFIC LOW POWER-SUPPLY VOLTAGE

BACKGROUND OF THE INVENTION

The present invention relates to an oscillation circuit.

Conventionally, an oscillation circuit as shown in FIG. 1 has been proposed as an oscillation circuit which can be produced on a semi-conductor substrate and operated by low power-supply voltage. This oscillation circuit is of the well-known ring type produced by complementary MOS semi-conductors, and comprises first through fourth unit circuits $6_1$–$6_4$ and a control circuit 7. The first through fourth unit circuits $6_1$–$6_4$ and the control circuit 7 are cascade-connected to each other. The control circuit 7 is provided between the second unit circuit $6_2$ and the third unit circuit $6_3$. As shown in FIG. 2, the first unit circuit $6_1$ comprises first and second inverter circuits $61_1$, $61_2$ and a delay circuit. The first and second inverter circuits $61_1$, $61_2$ are cascade-connected to each other. The delay circuit consists of a resistor R51 and a capacitor C51. The resistor R51 is provided between the first inverter circuit $61_1$ and the second inverter circuit $61_2$. The capacitor C51 is provided between the connection point of the resistor R51 with the second inverter circuit $61_2$ and the earth. The first inverter circuit $61_1$ functions as a switch for charging and discharging the capacitor C51. The second inverter circuit $61_2$ functions as a waveform shaper of an output signal of the delay circuit. The structures of the second through fourth unit circuits $6_2$–$6_4$ are similar to that of the first unit circuit $6_1$. The control circuit 7 has the well-known structure of 2NAND. When a control signal CNT inputted as one of two input signals is of high level, the control circuit 7 outputs a signal by inverting the polarity of the other input signal which is an output signal of the second unit circuit $6_2$. An output signal of the fourth unit circuit $6_4$ is fed back to the first unit circuit $6_1$.

The capacitor C51 is a MOS capacitor. The capacitor C51 with capacitance in the order of several pF can be produced on a semi-conductor substrate when viewed in terms of its area. The resistor 51 can be produced on the semi-conductor substrate according to its resistance by means of one of three methods described below.

(1) The method using the diffusion layers of P+ type and N+ type for forming the source and drain of a MOS transistor, when the resistance per unit area is of the order of 50 through 100 Ω.

(2) The method using poly-crystal silicon for forming the gate electrode of a MOS transistor, when the resistance per unit area is of the order of 20 through 40 Ω.

(3) The method using the ion implantation process for producing the resistor R51 should be added, when the resistance per unit area is of the order of 1 through 4 kΩ.

The temperature characteristics of the resistor R51 produced on the semi-conductor substrate according to the above three methods differs for each method. The temperature coefficient of the resistor R51 generally varies according to method used, with the method using poly-crystal silicon giving the lowest temperature coefficient, and the method involving the newly added ion implantation process providing the highest temperature coefficient. One of the above three methods is therefore selected according to the area on the substrate allocated for producing the resistor R51 and the characteristics to be required of the resistor R51. By means of one of the above three methods, it is possible to produce a resistor R51 with resistance of the order of several tens of kΩ on the semi-conductor substrate. The gate width of the first inverter circuit $61_1$ is determined so that the output resistance may become sufficiently smaller than the resistance of the resistor R51.

The oscillation frequency f of the oscillation circuit shown in FIG. 1 is given by the following equation.

$$1/f = 4 \times \tau_r + 4 \times \tau_f + \tau_0 \tag{1}$$

In equation (1), $\tau_r$ denotes the delay time of the delay circuit generated through a charging operation, $\tau_f$ the delay time of the delay circuit generated through a discharging operation, and $\tau_0$ the delay time of the control circuit 7. Usually, $\tau_0$ is sufficiently smaller than $\tau_r$ and $\tau_f$. The oscillation circuit shown in FIG. 1 can oscillate up to a frequency f of the order of several MHz. However, the duty factor of the output signal is determined by the ratio of $\tau_r$ to $\tau_f$. Since it is difficult to obtain the relation $\tau_r = \tau_f$ because of the dispersion to be generated in the production process, the duty factor of the output signal generally deviates from 50%.

As a method for preventing the duty factor of the output signal from deviating from 50%, there is the known method for making each unit circuit output a signal with the polarity opposite to that of the input signal. An example of the structure of the unit circuit of this method is shown in FIG. 3. The difference of a unit circuit 6a shown in FIG. 3 from the unit circuit $6_1$ shown in FIG. 2 is that a third inverter circuit $63_1$ is added to the former for inverting the polarity of the output signal of the second inverter circuit $62_1$. In the unit circuit 6a, since the duty factor is determined by the ratio $(\tau_r + \tau_f)(\tau_r + \tau_f)$, it is possible to reduce the dispersion of the duty factor. However, the unit circuit 6a has a relatively large dependence on the power-supply voltage.

As an example of unit circuit for solving the above problem regarding power-supply voltage, it is conceivable to use a unit circuit 6b as shown in FIG. 4, which includes a Schmidt circuit $64_1$ having input threshold with hysteresis characteristic in place of the second inverter circuit $62_1$ of the unit circuit $6_1$ shown in FIG. 2. By constructing the oscillation circuit by using the unit circuits 6b instead of the first through fourth unit circuits $6_1$–$6_4$, the dependence of the oscillation frequency on power-supply voltage is obtained by means of the circuit simulator. An example of the result is shown in FIG. 5. With this result, it has been confirmed that in the oscillation circuit composed by using the unit circuit 6b, the dependence of the oscillation frequency on power-supply voltage is scarcely detected even with power-supply voltage of not less than 3 volts, and thus stable oscillation is obtained when the power-supply voltage is in the low range of the order of three volts. However, it is also found that even in this oscillation circuit the dependence of the oscillation frequency on the power-supply voltage rapidly increases when the power-supply voltage becomes less than 3 volts. Therefore, when this oscillation circuit is used for a portable unit in which a power-supply voltage of about 2 volts is required for the semi-conductor integrated circuit, stable oscillation frequency cannot be obtained.

SUMMARY OF THE INVENTION

An object of the present invention is to provide an oscillation circuit which operates with stable oscillation frequency even when the power-supply voltage is of the order of 2 volts.

Other objects of the present invention will become obvious from the following description.

According to the present invention, an oscillation circuit comprises a capacitor which outputs a charge-discharge voltage; a first current source circuit of the current mirror type for determining the strength of a charging current which flows into the capacitor; a second current source circuit of the current mirror type for determing the strength of a discharging current which flows out from the capacitor; a switching circuit for selectively connecting either the first current source circuit or the second current source circuit with the capacitor; and a Schmidt circuit having a first and a second threshold voltage. The Schmidt circuit generates a control signal of a first level when the charge-discharge voltage to be inputted from the capacitor shifts to a voltage higher than the first threshold voltage and generates a control signal of a second level when the charge-discharge voltage shifts to a voltage lower than the second threshold voltage. The switching circuit connects the second current source circuit with the capacitor when the control signal is of the first level and connects the first current source circuit with the capacitor when the control signal is of the second level.

BRIEF DESCRIPTION OF THE DRAWINGS

The features and advantages of the present invention will become apparent from the following description taken in conjunction with the accompanying drawings in which.

DESCRIPTION OF THE PREFERRED EMBODIMENTS

Figure 1:
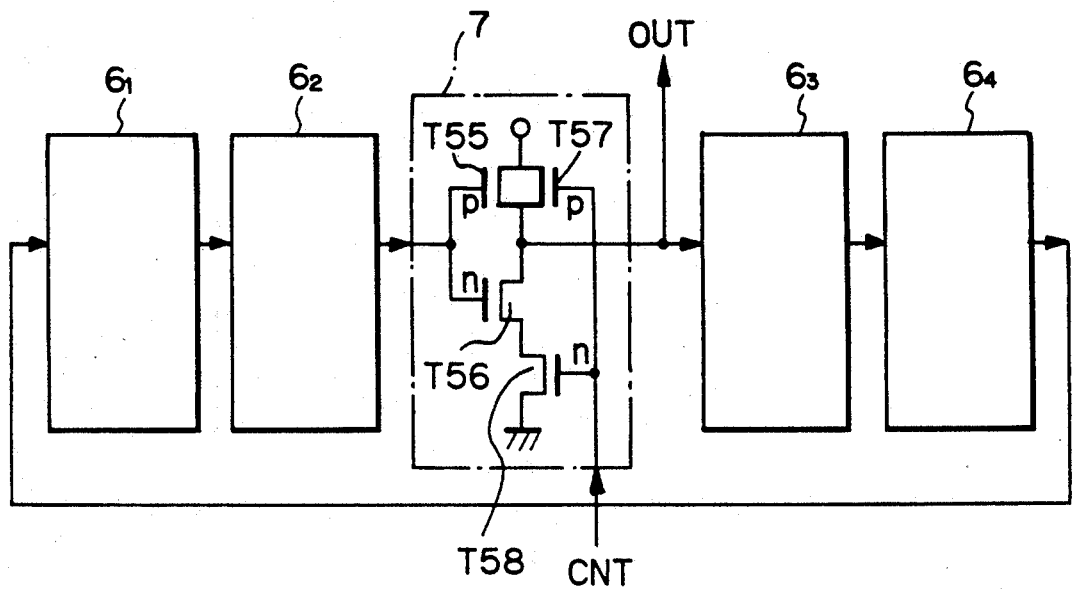
FIG. 1 is a block diagram showing an example of the oscillation circuit of the conventional type which can be produced on a semi-conductor substrate and operated with low power-supply voltage.
Figure 2:
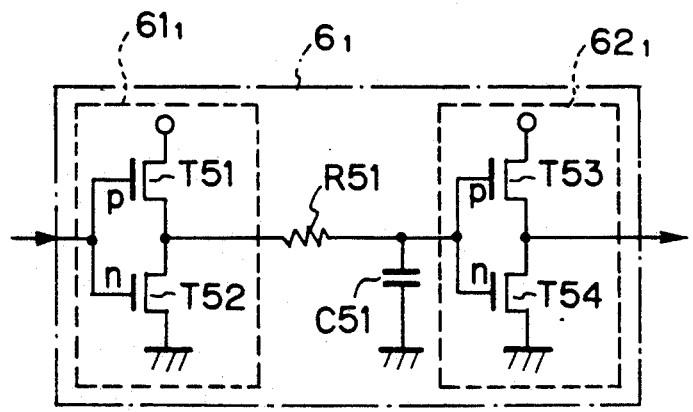
FIG. 2 is a circuit diagram showing the structure of the first unit circuit shown in FIG. 1.
Figure 3:
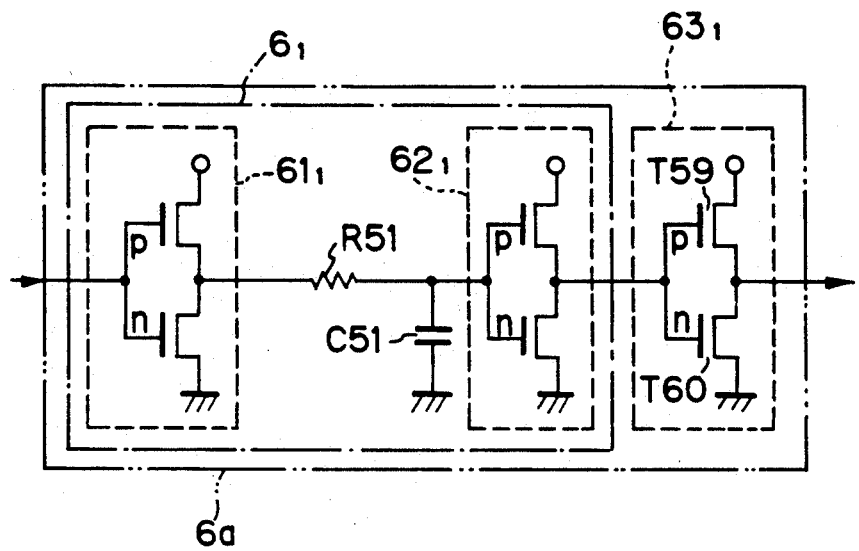
FIG. 3 is a circuit diagram showing the structure of a unit circuit which can prevent the deviation of the duty factor.
Figure 4:
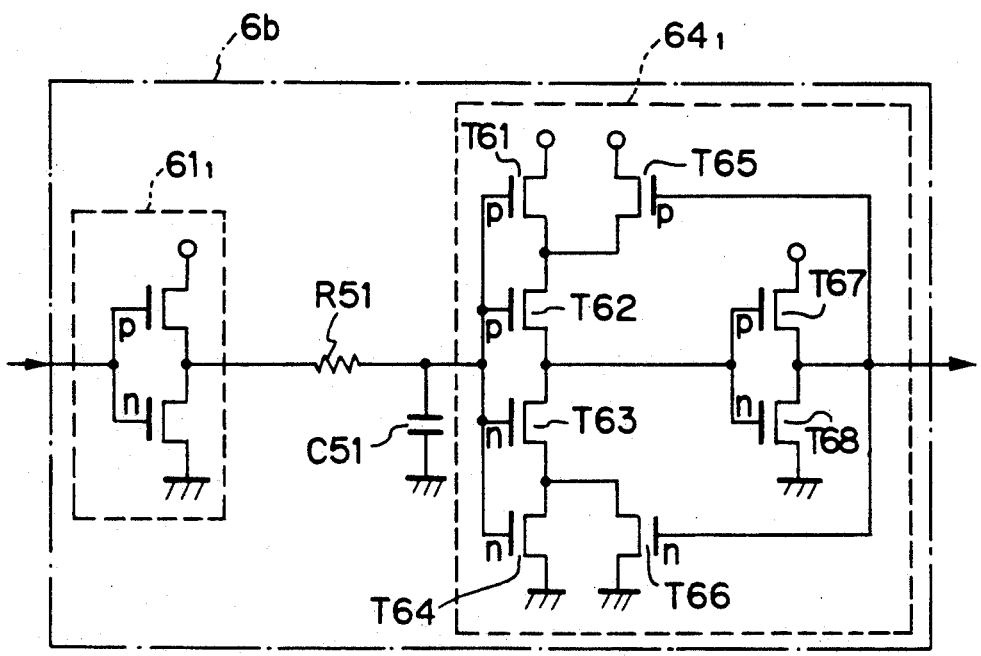
FIG. 4 is a circuit diagram showing the structure of a unit circuit which can improve the dependence of the oscillation frequency on power-supply voltage.
Figure 5:
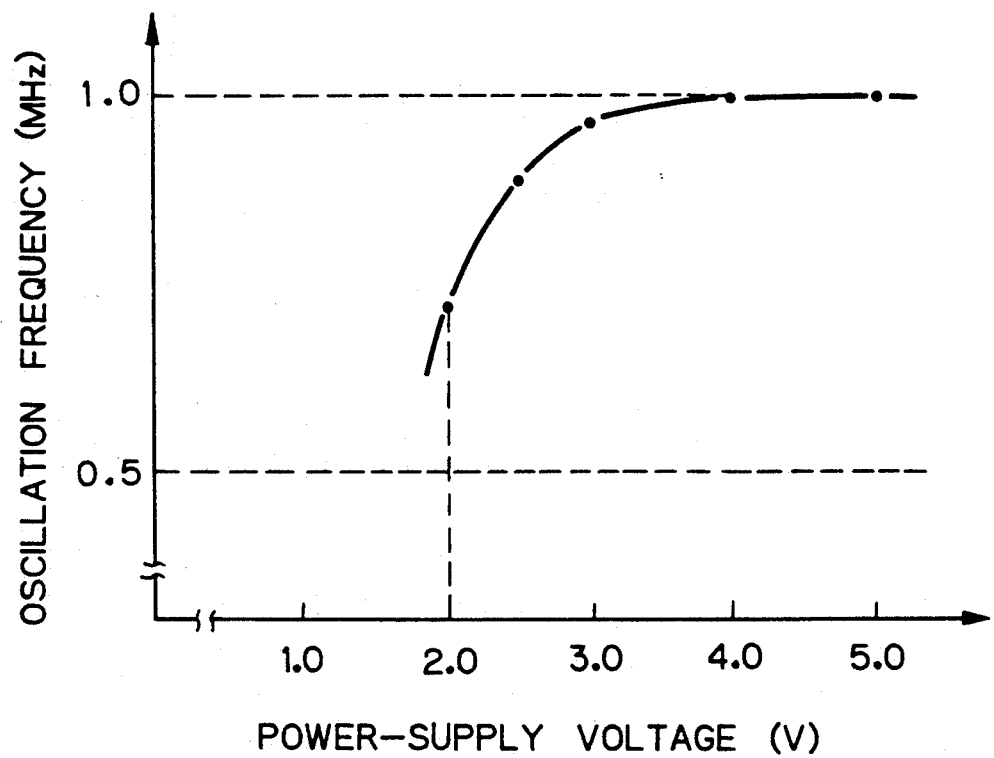
FIG. 5 is a graph showing an example of the results of simulation of the dependence of the oscillation frequency on power-supply voltage in the oscillation circuit composed of the unit circuit shown in FIG. 4.
Figure 6:
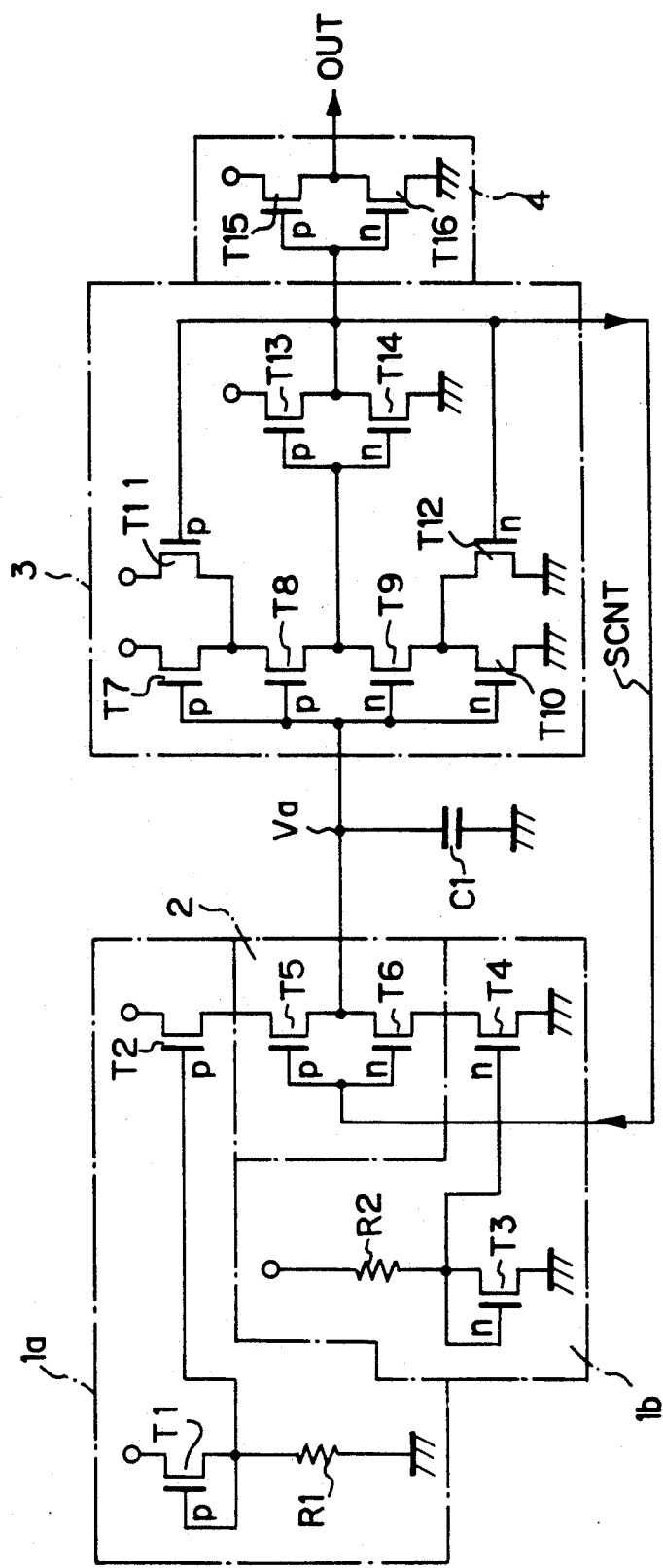
FIG. 6 is a circuit diagram showing the first embodiment of the oscillation circuit of the present invention.

The first embodiment of the oscillation circuit of the present invention comprises, as shown in FIG. 6, a first current source circuit 1a of the current mirror type, a second current source circuit 1b of the current mirror type, a switching circuit 2, a capacitor C1, a Schmidt circuit 3 and an output circuit 4. The first current source circuit 1a determines the strength of a charging current which flows to the capacitor C1. The second current source circuit 1b determines the strength of a discharging current flowing out from the capacitor C1. The switching circuit 2 connects the capacitor C1 selectively with either the first current source circuit 1a or the second current source circuit 1b. The capacitor C1 is provided between the connection point of the switching circuit 2 with the Schmidt circuit 3 and the earth and outputs a charge-discharge voltage Va. The Schmidt circuit 3 has a first threshold voltage $V_{TH}$ and a second threshold voltage $V_{TL}$. That is, when the charge-discharge voltage Va inputted from the capacitor C1 shifts from a voltage lower than the first threshold voltage $V_{TH}$ to a voltage higher than the first threshold voltage $V_{TH}$, the Schmidt circuit 3 generates a control signal SCNT of a first level $L_1$ (high level), and when the charge-discharge voltage Va shifts from a voltage higher than the second threshold voltage $V_{TL}$ to a voltage lower than the second threshold voltage $V_{TL}$, the Schmidt circuit 3 generates a control signal SCNT of a second level $L_2$ (low level). The switching circuit 2 connects the second current source circuit 1b with the capacitor C1 when the control signal SCNT is of the first level $L_1$ and connects the first current source circuit 1a with the capacitor C1 when the control signal SCNT is of the second level $L_2$.

The first current source circuit 1a consists of a first p-type MOS transistor T1, a first resistor R1 and a second p-type MOS transistor T2. The source of the first MOS transistor T1 is connected with a first power-supply voltage supply terminal. The gate and drain of the first MOS transistor T1 are connected with each other. One end of the first resistor R1 is connected with the drain of the first MOS transistor T1. The other end of the first resistor R1 is connected with the earth. The source of the second MOS transistor T2 is connected with the first power-supply voltage supply terminal. The gate of the second MOS transistor T2 is connected with the drain of the first MOS transistor T1.

The second current source circuit 1b consists of a third n-type MOS transistor T3, a second resistor R2, and a fourth n-type MOS transistor T4. The source of the third MOS transistor T3 is connected with the earth. The gate and drain of the third MOS transistor T3 are connected with each other. One end of the second resistor R2 is connected with the drain of the third MOS transistor T3. The other end of the second resistor R2 is connected with the first power-supply voltage supply terminal. The source of the fourth MOS transistor T4 is connected with the earth, and the gate thereof with the drain of the third MOS transistor T3.

The switching circuit 2 consists of a fifth p-type MOS transistor T5 and a sixth n-type MOS transistor T6. The source of the fifth MOS transistor T5 is connected with the drain of the second MOS transistor T2, and the gate thereof is supplied with the control signal SCNT. The source, gate, and drain of the sixth MOS transistor T6 are connected, respectively, with the drain of the fourth MOS transistor T4 and the gate and drain of the fifth MOS transistor T5.

One end of the capacitor C1 is connected with the drain of the fifth MOS transistor T5, and the other end of the capacitor C1 is connected with the earth.

The Schmidt circuit 3 comprises a seventh p-type MOS transistor T7, an eighth p-type MOS transistor T8, a ninth n-type MOS transistor T9, a tenth n-type MOS transistor T10, an eleventh p-type MOS transistor T11, a twelfth n-type MOS transistor T12, a thirteenth p-type MOS transistor T13 and a fourteenth n-type MOS transistor T14. The source of the seventh MOS transistor T7 is connected with the first power-supply voltage supply terminal, and the gate of the seventh MOS transistor T7 is supplied with the charge-discharge voltage Va. The source and gate of the eighth MOS transistor T8 are connected, respectively, with the drain and gate of the seventh MOS transistor T7. The drain and gate of the ninth MOS transistor T9 are connected, respectively, with the drain and gate of the eighth MOS transistor T8. The source of the tenth MOS transistor T10 is connected with the earth, and the drain and gate of the tenth MOS transistor are connected, respectively, with the source and gate of the ninth MOS transistor T9. The source and drain of the eleventh MOS transistor T11 are connected, respectively, with the first power-supply voltage supply terminal and the drain of the seventh MOS transistor T7. The source and drain of the twelfth MOS transistor T12 are connected, respectively, with the earth and the drain of the tenth MOS transistor T10. The gate of the eleventh MOS transistor T11 is connected with the gate of the twelfth MOS transistor T12.

The thirteenth MOS transistor T13 and the fourteenth MOS transistor T14 make up an inverter circuit which outputs the control signal SCNT. That is, the source and gate of the thirteenth MOS transistor T13 are connected, respectively, with the first power-supply voltage supply terminal and the drain of the eighth MOS transistor T8. The source, gate, and drain of the fourteenth MOS transistor T14 are connected, respectively, with the earth and the gate and drain of the thirteenth MOS transistor T13. The drain of the thirteenth MOS transistor T13 is connected with the gate of the eleventh MOS transistor T11.

The output circuit 4 consists of a fifteenth p-type MOS transistor T15 and a sixteenth n-type MOS transistor T16. The fifteenth MOS transistor T15 and the sixteenth MOS transistor T16 make up an inverter circuit which produces a output signal OUT by inverting the polarity of the control signal SCNT inputted from the Schmidt circuit 3. The source and gate of the fifteenth MOS transistor T15 are connected, respectively, with the first power-supply voltage supply terminal and the drain of the thirteenth MOS transistor T13. The source, gate, and drain of the sixteenth MOS transistor T16 are connected, respectively, with the earth and the gate and drain of the fifteenth MOS transistor T15.

Figure 7:
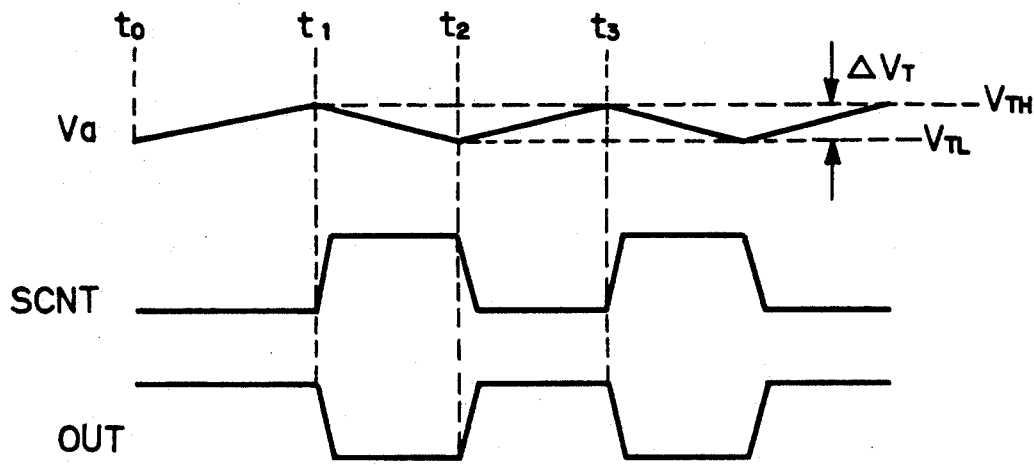
FIG. 7 is a wave diagram of the charge-discharge voltage, control signal, and output signal in the oscillation circuit shown in FIG. 6.

The operation of the oscillation circuit shown in FIG. 6 will next be described with reference to FIG. 7.

When the control signal SCNT becomes low at the time $t_0$, the fifth MOS transistor T5 is switched on and the sixth MOS transistor T6 is switched off in the switching circuit 2, as the result of which, the first current source circuit 1a and the capacitor C1 are connected with each other and the capacitor C1 is consequently charged to steadily increase the charge-discharge voltage Va. Thereafter, when the charge-discharge voltage Va becomes higher than the first threshold voltage $V_{TH}$ at the time $t_1$, the control signal SCNT output from the Schmidt circuit 3 becomes high, as a result of which the fifth MOS transistor T5 is switched off and the sixth MOS transistor T6 is switched on in the switching circuit 2. As a result, the second current source circuit 1b and the capacitor C1 are connected with each other, and the capacitor C1 is thereby discharged resulting in a steady decrease of the charge-discharge voltage Va. When the charge-discharge voltage Va subsequently decreases below the second threshold voltage $V_{TL}$ at the time $t_2$, the control signal SCNT output from the Schmidt circuit 3 becomes low, and the fifth MOS transistor T5 is thereby switched on and the sixth MOS transistor T6 is switched off in the switching circuit 2. As a result, the first current source circuit 1a and the capacitor C1 are connected with each other, and the capacitor C1 is thereby charged resulting in a steady increase of the charge-discharge voltage Va. Thereafter, when the charge-discharge voltage Va becomes higher than the first threshold voltage $V_{TH}$ at the time $t_3$, the control signal SCNT output from the Schmidt circuit 3 becomes high and causes the fifth MOS transistor T5 to be switched off and the sixth MOS transistor T6 to be switched on in the switching circuit 2. The second current source circuit 1b and the capacitor C1 are thereby connected with each other, and due to the discharge of the capacitor C1, there is a steady decrease of the charge-discharge voltage Va. Subsequently, similar operations are repeated. The charge-discharge voltage Va therefore becomes a triangular wave and reciprocates within the Schmidt width $\Delta V_T$ of the Schmidt circuit 3 which is represented by the difference between the first threshold voltage $V_{TH}$ and the second threshold voltage $V_{TL}$. The control signal SCNT and the output signal OUT of the output circuit 4 become square waves with a frequency which is determined by a charge-discharge time $\tau$ of the capacitor C1 expressed by the difference between times $t_3$ and $t_1$. The Schmidt width $\Delta V_T$ is given by the following equation by means of the charge-discharge time $\tau$, the electric current I to be determined by the first current source circuit 1a and the second current source circuit 1b, and capacity C of capacitor C1.

$$\Delta V_T = \frac{1}{2C} \int_o^\tau I\, dt \qquad (2)$$

Figure 8:
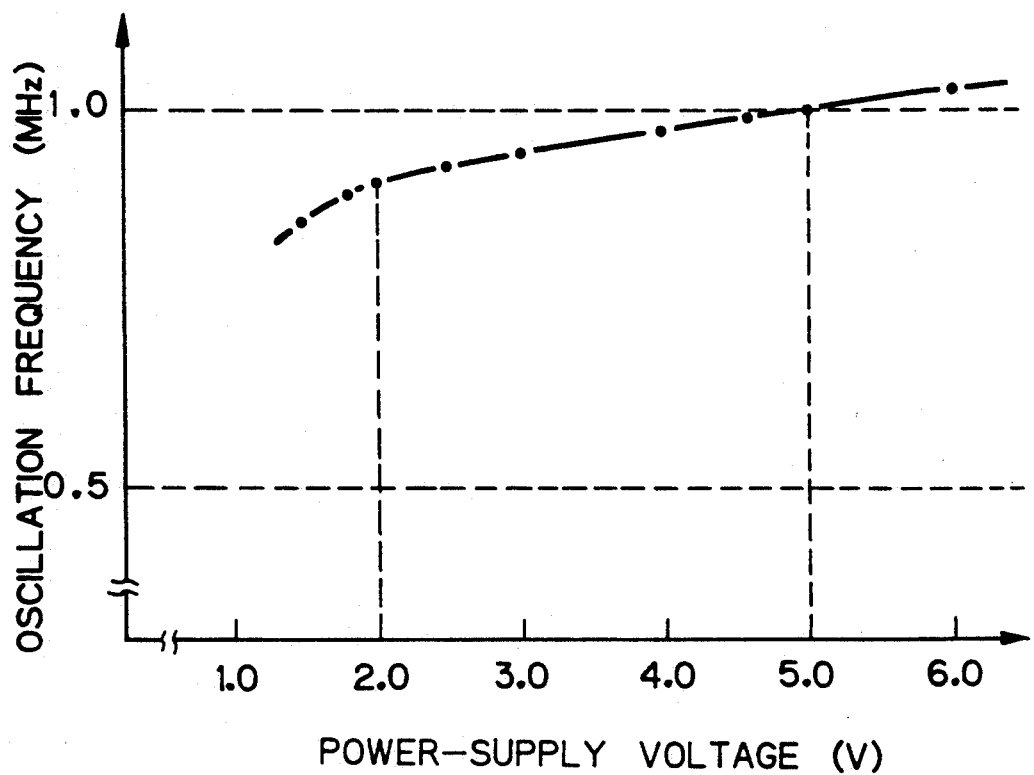
FIG. 8 is a graph showing an example of the results of simulation of the dependence of the oscillation frequency on power-supply voltage in the oscillation circuit shown in FIG. 6.

A simulation was performed by means of a circuit simulator for investigating the dependence of the oscillation frequency on power-supply voltage in the oscillation circuit shown in FIG. 6. An example of the simulation results is shown in FIG. 8. It has been confirmed with these simulation results that in the oscillation circuit shown in FIG. 6, the oscillation frequency does not vary rapidly even when the power-supply voltage drops less than 2 volts.

The reason for constructing the first current source circuit 1a of the current mirror type by using the first MOS transistor T1 together with constructing the second current source circuit 1b of the current mirror type by using the third MOS transistor T3 is to reduce the dispersion of oscillation frequency by compensating the variation of the Schmidt width $\Delta V_T$ which is caused by the dispersion of threshold voltage of p-type and n-type MOS transistors by adjusting an electric current of the first current source circuit 1a and the second current source circuit 1b.

Figure 9:
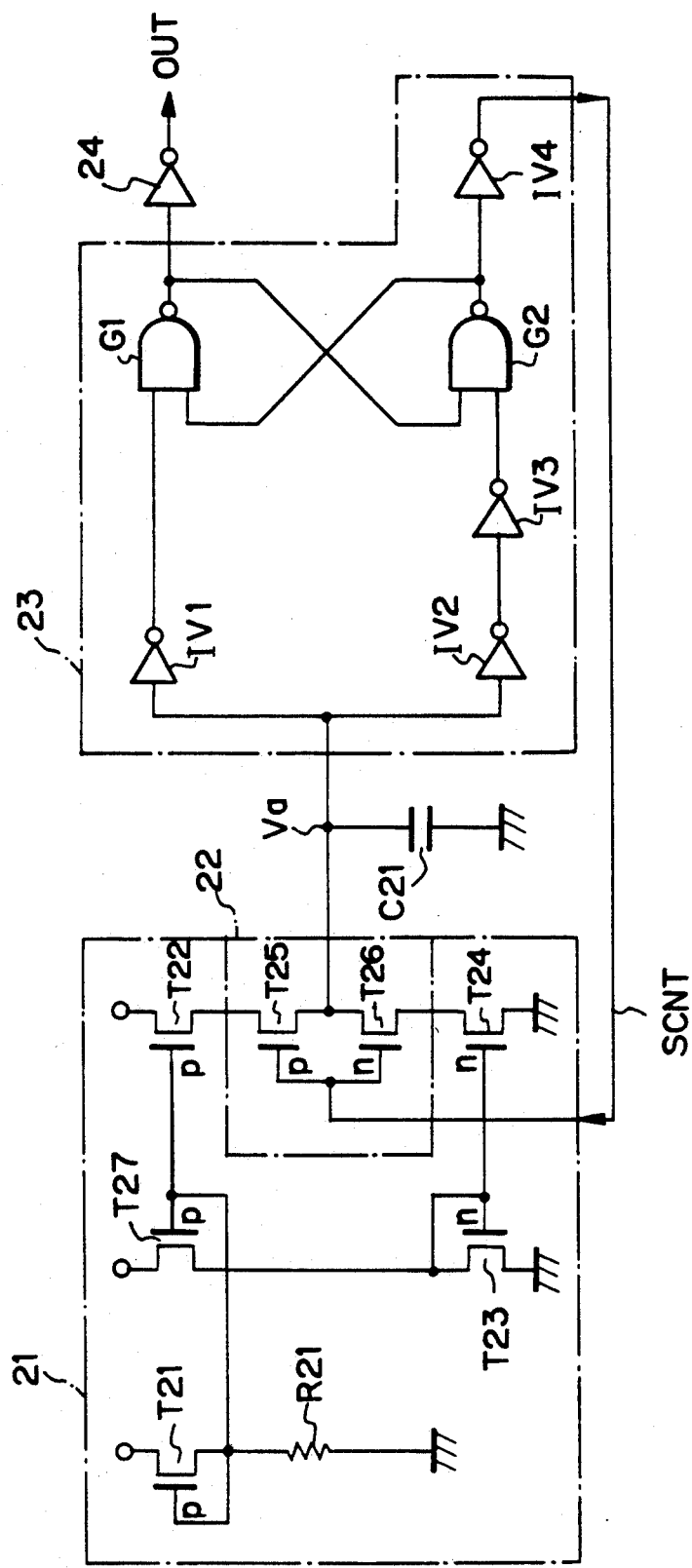
FIG. 9 is a circuit diagram showing the second embodiment of the oscillation circuit of the present invention.

As shown in FIG. 9, the second embodiment of the oscillation circuit of the present invention comprises a current-source circuit 21 of the current mirror type, a switching circuit 22, a capacitor C21, a Schmidt circuit 23, and an output circuit 24, wherein the current source circuit 21 is composed by using a constant-current source consisting of a twenty-first p-type MOS transistor T21 and a twenty-first resistor R21. In other words, in the current source circuit 21, the electric current flowing from the above constant-current source flows into the gate of a twenty-second p-type MOS transistor T22, which makes up the current mirror circuit together with the twenty-first MOS transistor T21, and flows into the gates of a twenty-third n-type MOS transistor T23 and a twenty-fourth n-type MOS transistor T24, which together make up the current mirror circuit, through a twenty-seventh p-type MOS transistor T27 which makes up the current mirror circuit together with the twenty-first MOS transistor T21. Therefore, in this oscillation circuit, there is an advantage that the electric current for charging the capacitor C21 through the twenty-second MOS transistor T22 and the electric current for discharging the capacitor C21 through the twenty-fourth MOS transistor T24 can be made equal, and it therefore becomes possible to make the equal duty factor of the output signal OUT 50%.

The structure of each component of this oscillation circuit will next be described in detail.

The current source circuit 21, which determines the electric current for charging and discharging the capacitor C21, comprises the twenty-first p-type MOS transistor T21, the twenty-first resistor R21, the twenty-second p-type MOS transistor T22, the twenty-third n-type MOS transistor T23, the twenty-fourth n-type MOS transistor T24 and the twenty-seventh p-type MOS transistor T27. The source of the twenty-first MOS transistor T21 is connected with the first power-supply voltage supply terminal, and the gate and drain thereof are connected with each other. One end of the twenty-first resistor R21 is connected with the drain of the twenty-first MOS transistor T21, and its other end is connected with the earth. The source and gate of the twenty-second MOS transistor T22 are connected with the first power-supply voltage supply terminal and the drain of the twenty-first MOS transistor T21, respectively. The source of the twenty-third MOS transistor T23 is connected with the earth, and the gate and drain thereof are connected with each other. The source and gate of the twenty-fourth MOS transistor T24 are connected with the earth and the drain of the twenty-third MOS transistor T23, respectively. The source, gate and drain of the twenty-seventh MOS transistor T27 are connected with the first power-supply voltage supply terminal, the drain of the twenty-first MOS transistor T21, and the drain of the twenty-third MOS transistor T23, respectively.

The switching circuit 22, which determines whether a charging current is allowed to flow from the current source circuit 21 to the capacitor C21 or a discharging current is allowed to flow from the capacitor C21 to the current source circuit 21, consists of a twenty-fifth p-type MOS transistor T25 and a twenty-sixth n-type MOS transistor T26. As the switching circuit 2 shown in FIG. 6, it functions by allowing the charging current to flow from the current source circuit 21 to the capacitor C21 when a control signal SCNT is of the first level $L_1$, and allowing the discharging current to flow from the capacitor C21 to the current source circuit 21 when the control signal SCNT is of the second level $L_2$. As for the source and gate of the twenty-fifth MOS transistor T25, the former is connected with the drain of the twenty-second MOS transistor T22 and the latter is supplied with the control signal SCNT. The source, gate, and drain of the twenty-sixth MOS transistor T26 are connected with the drain of the twenty-fourth MOS transistor T24, and the gate and drain of the twenty-fifth MOS transistor T25, respectively.

The capacitor C21, which outputs a charge-discharge voltage Va, is provided between the connection point of the switching circuit 22 with the Schmidt circuit 23 and the earth in the same way as the capacitor C1 shown in FIG. 6. That is, one end of the capacitor C21 is connected with the drain of the twenty-fifth MOS transistor T25, and the other end thereof with the earth.

The Schmidt circuit 23, which generates the control signal SCNT, has a different structure from the Schmidt circuit 3 shown in FIG. 6, but it functions in the same way. The Schmidt circuit 23 comprises a first inverter circuit IV1 which has a first threshold voltage $V_{TH}$, a second inverter circuit IV2 which has a second threshold voltage $V_{TL}$, a third inverter circuit IV3 which inverts the polarity of an output signal of the second inverter circuit IV2, a first 2NAND circuit G1 and a second 2NAND circuit G2 which form a flip-flop circuit whose input signals are composed of output signals of the first inverter circuit IV1 and the third inverter circuit IV3, and a fourth inverter circuit IV4 which generates the control signal SCNT by inverting the polarity of an output signal of the second 2NAND circuit G2. Therefore, the Schmidt circuit 23 has the first threshold voltage $V_{TH}$ and the second threshold voltage $V_{TL}$ and generates the control signal SCNT of the first level $L_1$ (high level) when the charge-discharge voltage Va to be inputted from the capacitor C21 changes from voltage lower than the first threshold voltage $V_{TH}$ to a higher voltage and generates the control signal SCNT of the second level $L_2$ (low level) when the charge-discharge voltage Va changes from voltage higher than the second threshold voltage $V_{TL}$ to a lower voltage.

The output circuit 24, which generates the output signal OUT, comprises an inverter circuit and produces the output signal OUT by inverting the polarity of an output signal of the first 2NAND circuit G1.

The description of the operation of this oscillation circuit is omitted because it is similar to that of the oscillation circuit shown in FIG. 6.

Figure 10:
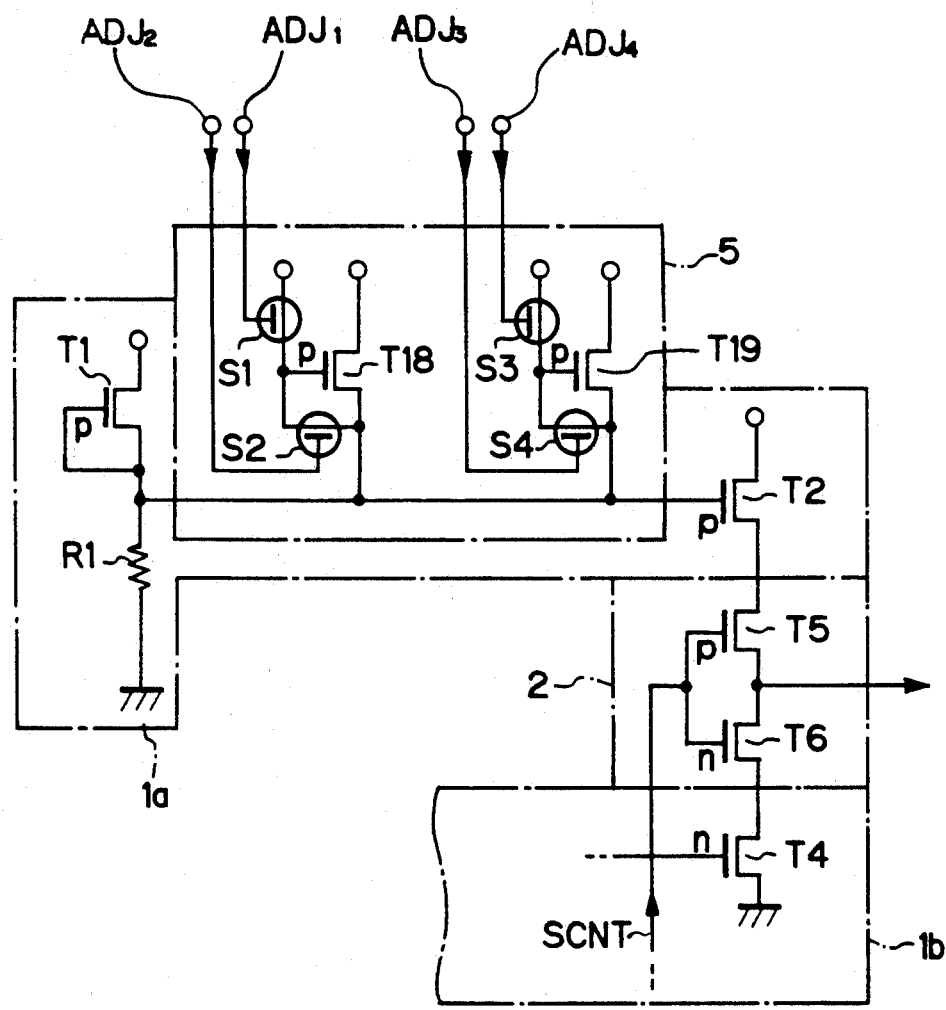
FIG. 10 is a circuit diagram showing the third embodiment of the oscillation circuit of the present invention.

The third embodiment of the oscillation circuit of the present invention will next be described with reference to FIG. 10.

This oscillation circuit differs from the oscillation circuit shown in FIG. 6 in that it has a coordination circuit 5 for coordinating the strength of a current which flows out of the first current source circuit 1a.

The coordination circuit 5 consists of two p-type MOS transistors T18, T19 and four switching elements S1–S4. The source and drain of the eighteenth MOS transistor T18 are connected with the first power-supply voltage supply terminal and the gate of the second MOS transistor T2, respectively. The source and drain of the nineteenth MOS transistor T19 are connected with the first power-supply voltage supply terminal and the gate of the second MOS transistor T2, respectively. The first switching element S1 is provided between the first power-supply voltage supply terminal and the gate of the eighteenth MOS transistor T18, and its on/off switching operation is controlled by a first control signal ADJ1 which is inputted from outside. The second switching element S2 is provided between the gate and drain of the eighteenth MOS transistor T18, and its on/off switching operation is controlled by a second control signal ADJ2 which is inputted from outside. The third switching element S3 is provided between the first power-supply voltage supply terminal and the gate of the nineteenth MOS transistor T19, and its on/off switching operation is controlled by a third control signal ADJ3 which is inputted from outside. The fourth switching element S4 is provided between the gate and drain of the nineteenth MOS transistor T19, and its on/off switching operation is controlled by a fourth control signal ADJ4 which is inputted from outside.

Since the coordination circuit 5 is constructed as described above, it can control the on/off switching operations of each of the MOS transistors T18, T19 by controlling the on/off operations of the respective switching elements S1–S4 by using the respective control signals ADJ1–ADJ4. As a result, it is possible to coordinate the strength of the current which flows into the gate of the second MOS transistor T2 by means of the control signals ADJ1–ADJ4, and it in turn becomes possible to optionally change the ratio between the charging current which flows into the capacitor C1 (refer to FIG. 6) and the discharging current which flows out from the capacitor C1. Therefore, with this oscillation circuit, it is possible to compensate the dispersion of the oscillation frequency and the duty factor of the output signal OUT which may be generated by causes attributable to the production process.

The coordination circuit 5 is provided only in the first current source circuit 1a in this oscillation circuit, although it can be provided only in the second oscillation circuit 1b or in both of them. When the coordination circuit 5 is provided in both the first current source circuit 1a and the second current source circuit 1b, it becomes possible to compensate the dispersion of the oscillation frequency and the duty factor of the output signal OUT more minutely and precisely.

Each of the switching elements S1–S4 may be constructed with a transistor, or a fuse made of silicon, or non-volatile memories such as EPROM or EEPROM, or a combination of a resistor element and a switching element.

The fourth embodiment of the oscillation circuit of the present invention will next be described with reference to FIG. 11.

This oscillation circuit comprises a current source circuit 1A and two unit circuits 6A and 6B. The unit circuit 6A, which outputs a first output signal OUT1, is composed of the second MOS transistor T2, the fourth MOS transistor T4, the switching circuit 2, the capacitor C1 and the Schmidt circuit 3, all of which are similar to the components shown in FIG. 6. The unit circuit 6B, which outputs a second output signal OUT2, is also constructed in the same way as the unit circuit 6A. The second MOS transistor T2 and the fourth MOS transistor T4 which compose the unit circuit 6A and the similar set of similar transistors which compose the unit circuit 6B are both operated by the current source circuit 1A. The current source circuit 1A is equivalent to the current source circuit 21 shown in FIG. 9.

Due to the structure of this oscillation circuit as described above, it can simultaneously generate two output signals OUT1, OUT2 which each have different oscillation frequencies by changing the capacity of each capacitor C1 which composes the unit circuit 6A, 6B, or by changing the current ratio between the currents which flow in respective sets of the second MOS transistor T2 and the fourth MOS transistor T4 which compose the unit circuit 6A and the unit circuit 6B.

Figure 12:
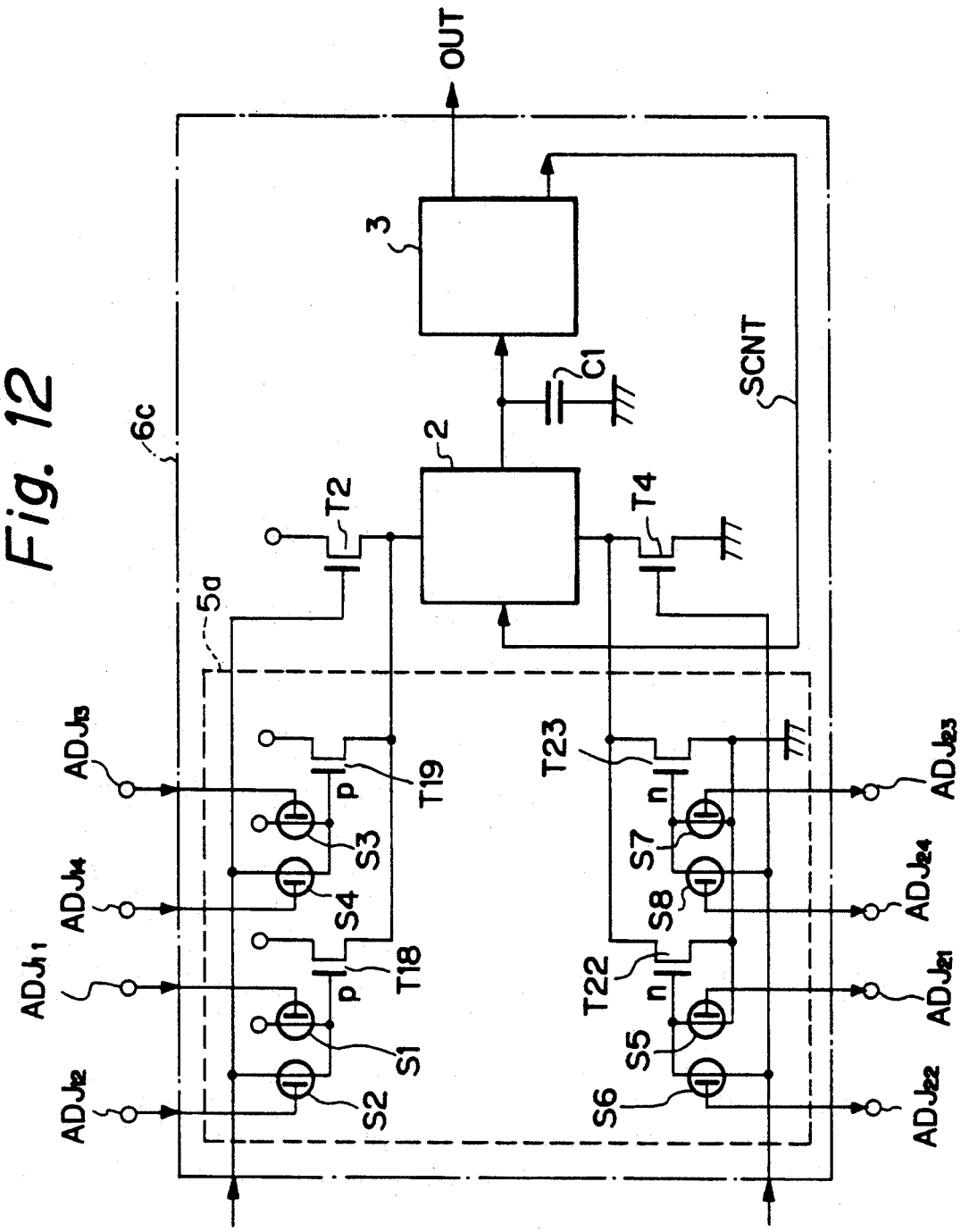
FIG. 12 is a circuit diagram showing the fifth embodiment of the oscillation circuit of the present invention.

The fifth embodiment of the oscillation circuit of the present invention will next be described with reference to FIG. 12.

Figure 11:
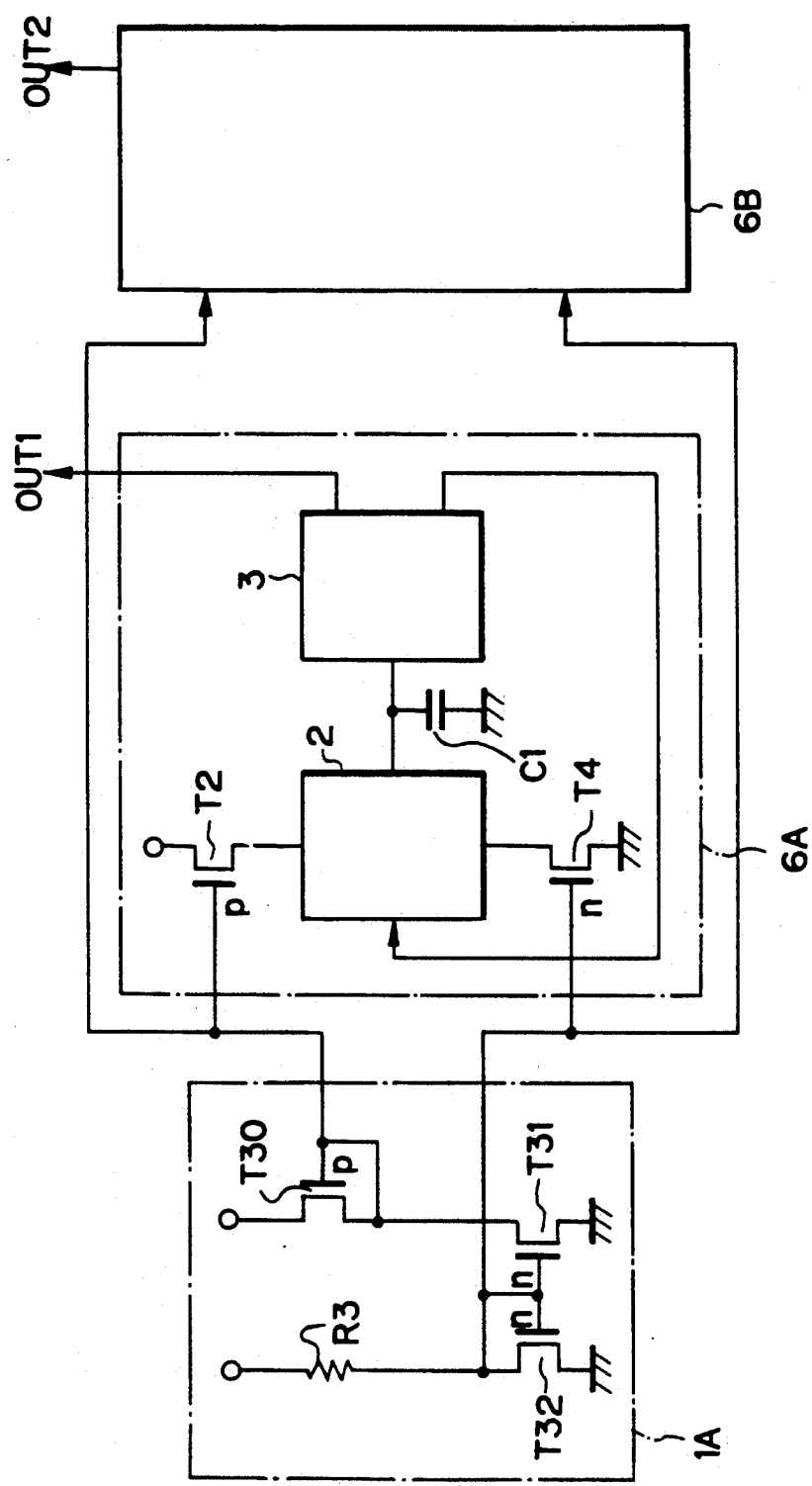
FIG. 11 is a circuit diagram showing the fourth embodiment of the oscillation circuit of the present invention.

This oscillation circuit differs from the oscillation circuit shown in FIG. 11 in that a unit circuit 6C has a coordination circuit 5a which coordinates the strengths of the charging and discharging currents of the capacitor C1. By connecting a plurality of unit circuits 6C with one current source circuit, it becomes possible to obtain a plurality of output signals whose oscillation frequencies or duty factors can each be controlled from the outside. Thus, it becomes possible to extend the application area of the oscillation circuit.

As described above, the oscillation frequency of the oscillation circuit of the present invention varies according to the capacity of the capacitor and the resistance of the resistor of the current source circuit; however, it is possible to get output signals having oscillation frequencies of the order of several MHz by employing a capacitor with a capacity of 1 through 10 pF and a resistor with resistance of 10 through 100 kΩ.

While this invention has been described in conjunction with the preferred embodiments thereof, it will now be possible for one skilled in the art to readily put this invention into practice in various other manners.

What is claimed is:

1. An oscillation circuit comprising:
   a capacitor which outputs a charge-discharge voltage;
   a first current source circuit of the current mirror type for determining the strength of a charging current which flows into said capacitor;
   a second current source circuit of the current mirror type for determining the strength of a discharging current which flows out from said capacitor;
   a switching circuit for selectively connecting either said first current source circuit or said second current source circuit with said capacitor; and
   a Schmidt circuit having a first and a second threshold voltage;
   wherein:
   said Schmidt circuit generates a control signal of a first level when said charge-discharge voltage to be inputted from said capacitor shifts to voltage higher than said first threshold voltage and generates a control signal of a second level when said charge-discharge voltage shifts to a voltage lower than said second threshold voltage; and
   said switching circuit connects said second current source circuit with said capacitor when said control signal is of said first level and connects said first current source circuit with said capacitor when said control signal is of said second level; and said oscillation circuit further including a first power-supply voltage supply terminal and a second power-supply voltage supply terminal wherein
said first current source circuit comprises:
a first transistor of one conduction type, the gate and drain of which are connected with each other and the source of which is connected with said first power-supply voltage supply terminal,
a first resistor, one end of which is connected with the drain of said first transistor and the other end of which is connected with said second power-supply voltage supply terminal, and
a second transistor of said one conduction type, the source of which is connected with said first power-supply voltage supply terminal and the gate of which is connected with the drain of said first transistor;
said second current source circuit comprises:
a third transistor of another conduction type, the gate and drain of which are connected with each other and the source of which is connected with said second power-supply voltage supply terminal,
a second resistor, one end of which is connected with the drain of said third transistor and the other end of which is connected with said first power-supply voltage supply terminal, and
a fourth transistor of said another conduction type, the source of which is connected with said second power-supply voltage supply terminal and the gate of which is connected with the drain of said third transistor;
said switching circuit comprising:
a fifth transistor of said one conduction type, the source of which is connected with the drain of said second transistor and the gate of which is supplied with said control signal, and
a sixth transistor of said another conduction type, the gate and drain of which are connected with the gate and drain, respectively, of said fifth transistor and the source of which is connected with the drain of said fourth transistor;
and said capacitor is provided between the drain of said fifth transistor and said second power-supply voltage supply terminal.

2. An oscillation circuit according to claim 1 wherein said first, second, and fifth transistors are P-type MOS transistors; and said third, fourth and sixth transistors are n-type MOS transistors.

3. An oscillation circuit according to claim 2 wherein said second power-supply voltage supply terminal is connected with the earth.

4. An oscillation circuit according to any one of claim 1 through claim 3 further including at least one of a first coordination circuit for coordinating the strength of said charging current which flows out from said first current source circuit into said capacitor and a second coordination circuit for coordinating the strength of said discharging current which flows out from said capacitor to said second current source circuit, wherein said first coordination circuit includes a transistor whose on/off switching operation is controlled by one control signal inputted from outside, and said second coordination circuit includes a transistor whose on/off switching operation is controlled by another control signal inputted from outside.

5. An oscillation circuit comprising:
a capacitor which outputs a charge-discharge voltage;
a current source circuit of the current mirror type for determining the strength of a charging current which flows into said capacitor and the strength of a discharging current which flows out from said capacitor;
a switching circuit for selecting whether said charging current flows from said current source circuit to said capacitor or from said capacitor to said current source circuit; and
a Schmidt circuit which has a first and a second threshold voltage wherein:
said Schmidt circuit generates a control signal of a first level when said charge-discharge voltage to be inputted from said capacitor shifts to voltage higher than said first threshold voltage and generates a control signal of a second level when said charge-discharge voltage shifts to a voltage lower than said second threshold voltage; and
said switching circuit causes said discharging current to flow from said capacitor to said current source circuit when said control signal is of said first level and causes said charging current to flow from said current source circuit to said capacitor when said control signal is of said second level; and
said oscillation circuit further including a first power-supply voltage supply terminal and a second power-supply voltage supply terminal wherein
said current source circuit comprises:
a first transistor of one conduction type, the gate and drain of which are connected with each other and the source of which is connected with said first power-supply voltage supply terminal,
a resistor, one end of which is connected with the drain of said first transistor and the other end of which is connected with said second power-supply voltage supply terminal,
a second transistor of said one conduction type, the source of which is connected with said first power-supply voltage supply terminal and the gate of which is connected with the drain of said first transistor,
a third transistor of another conduction type, the gate and drain of which are connected with each other and the source of which is connected with said second power-supply voltage supply terminal,
a fourth transistor of said another conduction type, the source of which is connected with said second power-supply voltage supply terminal and the gate of which is connected with the drain of said third transistor, and
a fifth transistor of said one conduction type, the source, gate, and drain of which are connected with said first power-supply voltage supply terminal, the drain of said first transistor, and the drain of said third transistor respectively;
said switching circuit comprises:
a sixth transistor of said one conduction type, the source of which is connected with the drain of said second transistor and the gate of which is supplied with said control signal, and
a seventh transistor of said another conduction type, the source, gate and drain of which are connected with the drain of said fourth transistor and the gate and drain of said sixth transistor, respectively;
and said capacitor is provided between the drain of said sixth transistor and said second power-supply voltage supply terminal.

6. An oscillation circuit according to claim 5 wherein said first, second, fifth, and sixth transistors are p-type MOS transistors; and said third, fourth, and seventh transistors are n-type MOS transistors.

7. An oscillation circuit according to claim 6 wherein said second power-supply voltage supply terminal is connected with the earth.

* * * * *